United States Patent [19]
Allman et al.

[11] Patent Number: 5,340,770
[45] Date of Patent: Aug. 23, 1994

[54] METHOD OF MAKING A SHALLOW JUNCTION BY USING FIRST AND SECOND SOG LAYERS

[75] Inventors: Derryl D. J. Allman, Colorado Springs, Colo.; Dim-Lee Kwong, Austin, Tex.

[73] Assignee: NCR Corporation, Dayton, Ohio

[21] Appl. No.: 965,822

[22] Filed: Oct. 23, 1992

[51] Int. Cl.$^5$ .......................... H01L 21/225
[52] U.S. Cl. .................. 437/164; 437/152; 437/950
[58] Field of Search ............... 437/57, 58, 152, 164, 437/231, 240, 934, 950, 978, 982; 148/DIG. 43, DIG. 133, DIG. 144, DIG. 151

[56] References Cited

U.S. PATENT DOCUMENTS

| | | | |
|---|---|---|---|
| 3,608,189 | 9/1971 | Gray | 437/164 |
| 3,673,679 | 7/1972 | Carbajal, III et al. | 437/164 |
| 3,789,023 | 1/1974 | Ritchie | 148/DIG. 151 |
| 3,837,873 | 9/1974 | Pollack et al. | 437/164 |
| 3,928,225 | 12/1975 | Schäfer | 437/164 |
| 4,355,454 | 10/1982 | Tasch, Jr. et al. | 437/164 |
| 4,433,008 | 2/1984 | Schnable et al. | 437/164 |
| 4,455,325 | 6/1984 | Razouk | 437/982 |
| 4,521,441 | 6/1985 | Flowers | 437/164 |
| 4,571,366 | 2/1986 | Thomas et al. | 437/164 |
| 4,603,468 | 8/1986 | Lam | 437/164 |
| 4,606,114 | 8/1986 | Kraus | 437/982 |
| 4,628,589 | 12/1986 | Sundaresan | 437/231 |
| 4,661,177 | 4/1987 | Powell | 437/164 |
| 4,830,974 | 5/1989 | Chang et al. | 437/240 |
| 4,835,113 | 5/1989 | Celler et al. | 437/164 |
| 4,837,179 | 6/1989 | Foster et al. | 437/164 |
| 4,879,253 | 11/1989 | Wakamatsu | 437/982 |
| 4,891,331 | 1/1990 | Rapp | 437/164 |
| 4,962,049 | 10/1990 | Chang et al. | 437/241 |
| 4,996,168 | 2/1991 | Ozaki et al. | 437/152 |
| 5,024,959 | 6/1991 | Pfiester | 437/164 |
| 5,047,357 | 9/1991 | Eklund | 437/950 |
| 5,116,778 | 5/1992 | Haskell et al. | 437/164 |

FOREIGN PATENT DOCUMENTS

| | | |
|---|---|---|
| 0441482 | 1/1991 | European Pat. Off. |
| 53-135263 | 11/1978 | Japan |
| 0008818 | 3/1980 | Japan ............ 437/152 |
| 57-194525 | 11/1982 | Japan |
| 61-87322 | 5/1986 | Japan |
| 62-60220 | 3/1987 | Japan |
| 62-216322 | 9/1987 | Japan |
| 1-8615 | 1/1989 | Japan |
| 1-194416 | 8/1989 | Japan |
| 1100973 | 8/1989 | Japan |
| 1173755 | 10/1989 | Japan |
| 1-283828 | 11/1989 | Japan |
| 2007558 | 3/1990 | Japan |
| 2087567 | 6/1990 | Japan |
| 2188914 | 10/1990 | Japan |
| 2284463 | 2/1991 | Japan |
| 0218025 | 9/1991 | Japan |

OTHER PUBLICATIONS

Wolf, S. "Silicon Processing for the VLSI Era", p. 208, 1990.

*Primary Examiner*—Tom Thomas
*Assistant Examiner*—C. Chaudhari
*Attorney, Agent, or Firm*—Paul W. Martin

[57] ABSTRACT

A shallow junction spin on glass (SOG) process which provides shallow junction semiconductor devices without defects and leaky junctions. The process includes spinning first and second SOG layers containing first and second dopants onto a semiconductor substrate and diffusing the dopants into the substrate to form first and second junctions. The diffusion time and temperature are controlled so as to produce junctions having depths less than a predetermined maximum depth. Insulating and metal interconnect layers are deposited on top of the SOG layers. The insulating layer may include boron-phosphorus silicon glass (BPSG).

20 Claims, 3 Drawing Sheets

METHOD OF MAKING A SHALLOW JUNCTION BY USING FIRST AND SECOND SOG LAYERS

CROSS REFERENCE TO RELATED APPLICATIONS

The present invention is related to the following commonly assigned and co-pending U.S. applications, which have been filed concurrently with the present application:

"Selective Sidewall Diffusion Process Using Doped SOG", invented by Allman et al., and having a Ser. No. 07/961,967, now U.S. Pat. No. 5,308,790;

"Method for Forming a Bipolar Emitter Using Doped SOG", invented by Allman et al., and having a Ser. No. 07/961,973;

"Bipolar Transistor Formation Using Doped SOG", invented by Allman et al., and having a Ser. No. 07/965,823; and "Global Planarization Using Doped SOG and Chemical Metal Polish", invented by Allman et al., and having a Ser. No. 07/965,309 now U.S. Pat. No. 5,312,512.

BACKGROUND OF THE INVENTION

The present invention relates to methods for producing integrated circuit devices and more specifically to a shallow junction spin on glass (SOG) process.

Known methods for forming junctions between semiconductor materials involve a masking operation followed by an implant operation in which n-type and p-type impurities are implanted into a substrate, typically silicon. In such a process, the implant energy has to be reduced to produce shallow junctions.

This method suffers from the disadvantage that implanting produces defects which lie in the space charge region of the junction. The implanted impurity is brought to rest by an inelastic collision with silicon atoms in the crystal lattice, which damages the crystal lattice structure by knocking silicon atoms out of place. The crystal lattice structure must be epitaxially regrown by an activation anneal, which can be a rapid thermal process (RTP) cycle. However, the anneal process causes undesirable enhanced diffusion. The damage from implanting is not totally repairable. Defect sites having energies in the middle of the band gap remain and produce a conduction path which ultimately causes a leakage current to flow through the junction.

Therefore, it would be desirable to provide a process for forming shallow junctions which does not suffer from the disadvantages of implanting.

SUMMARY OF THE INVENTION

In accordance with the teachings of the present invention, a shallow junction SOG process is provided. The process includes spinning first and second SOG layers containing first and second dopants onto a semiconductor substrate and diffusing the dopants into the substrate to form first and second junctions. The diffusion time and temperature are controlled so as to produce junctions having depths less than a predetermined maximum depth. Insulating and metal interconnect layers are deposited on top of the SOG layers. The insulating layer may include boron-phosphorous silicon glass (BPSG), which is densified, etched, and reflowed to planarize the device.

It is accordingly an object of the present invention to provide a shallow junction SOG process.

It is another object of the present invention to provide a shallow junction SOG process which provides shallow junction semiconductor devices without defects and leaky junctions.

BRIEF DESCRIPTION OF THE DRAWINGS

Additional benefits and advantages of the present invention will become apparent to those skilled in the art to which this invention relates from the subsequent description of the preferred embodiments and the appended claims, taken in conjunction with the accompanying drawings in which:

DETAILED DESCRIPTION OF THE PREFERRED EMBODIMENT

Figure 1:
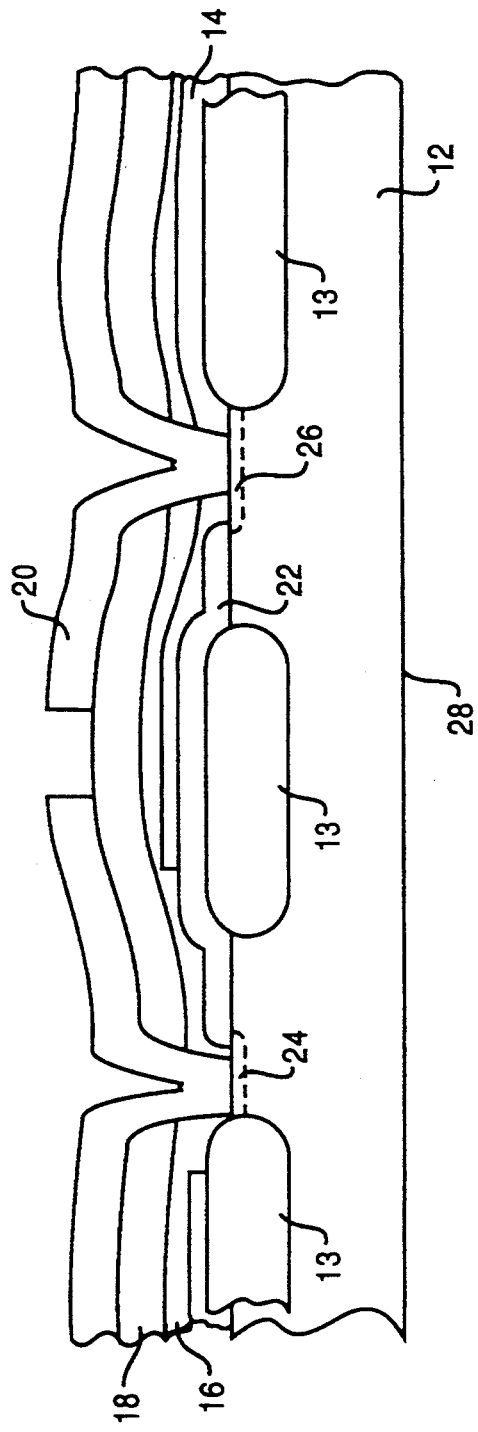
FIG. 1 is a cross-sectional view of a CMOS device.

Referring now to FIG. 1, a complementary metal-oxide-semiconductor (CMOS) device 10 manufactured using a first embodiment of the method of the present invention is shown. Device 10 includes underlying silicon wafer 12, containing field oxide deposits 13. Over substrate 12 are layer 14 of phosphorus-doped SOG, layer 16 of boron-doped SOG, insulating layer 18, and metal interconnect layer 20. A p+ junction 24 and an n+ junction 26 lie within silicon wafer 12. Layer 22 is a polysilicon layer. Other dopants, such as arsenic and gold may also be employed in addition to the boron and phosphorus.

Device 10 is a MOSFET device, although other devices are also envisioned by the present invention. Junction 24 forms the drain and junction 26 forms the source.

Figure 3:
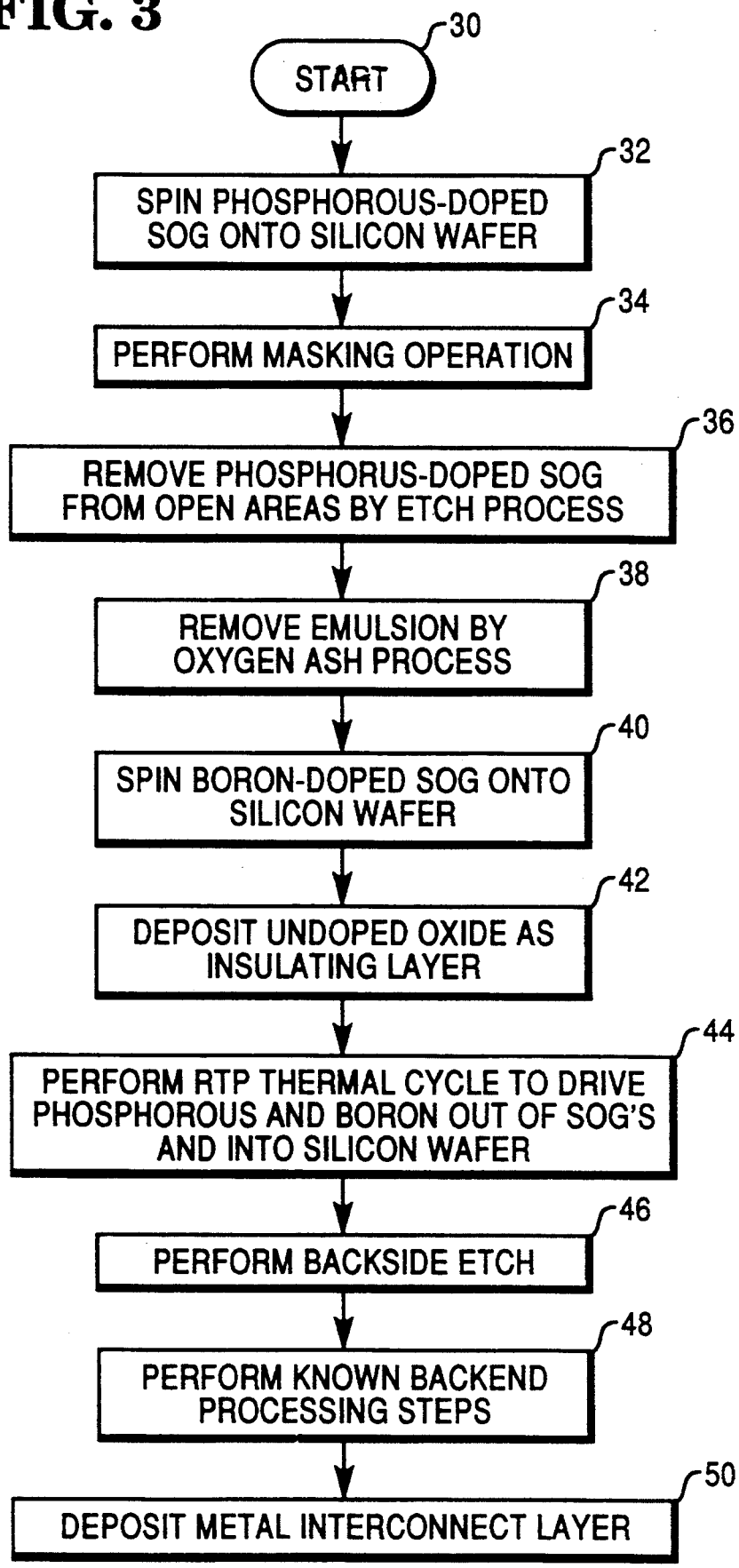
FIG. 3 is a flow diagram of a first embodiment of the present invention.

Referring now to FIG. 3, the method of the present invention begins at START 30. In block 32, phosphorus-doped SOG, which is in a liquid state, is spun onto silicon wafer 12 to form layer 14. Spinning produces centrifugal forces which separate and dry the majority of the liquid from the polymer, leaving behind a flat polymer surface. Preferably, layer 14 is about 1500 angstroms thick on a flat surface.

In block 34, a masking operation using an etch-resistant emulsion is performed to prevent portions of layer 14 from being removed by a subsequent etch. In the case of a MOSFET, a n+ source and p+ drain masking operation is performed.

In block 36, the phosphorus-doped SOG of layer 14 is selectively removed from the unmasked areas by an etch process. Unmasked or open areas correspond to areas reserved for other dopants besides phosphorus. Thus, the phosphorus-doped SOG must be removed before a subsequent thermal process in order to prevent contamination of the underlying area with phosphorus impurities. Preferably, a fluorine plasma etch process is used. Other plasma etch environments include chlorine and bromine. Instead, a wet chemical etch process may be employed to remove the SOG. Preferred wet chemical etches are oxidizing etches, employing acids such as nitric, sulfuric, phosphoric, or hydroflouric.

In block 38, the emulsion used during masking is removed by a plasma oxygen ashing process or a cleaning with a solvent.

In block 40, boron-doped SOG is spun onto the surface of wafer 12 to form layer 16. Preferably, layer 16 is about 1500 Angstroms thick on a flat surface. Advantageously, the spinning process planarizes the CMOS topology to provide the degree of planarization necessary for good contact between metal interconnect layer 20 and the rest of device 10.

In block 42, insulating layer 18 is deposited over layer 16. Preferably, layer 18 includes a silicon oxide layer, which is about 5000 Angstroms thick in order to provide sufficient insulation between polysilicon layer 22 and metal interconnect layer 20.

In block 44, phosphorus and boron are driven out of layers 14 and 16, respectively, and into silicon wafer 12 by an RTP cycle to form n+ junction 26 and p+ junction 24, respectively. Optionally, boron and phosphorus may be driven into silicon wafer 12 in two separate RTP thermal cycles.

Figure 2:
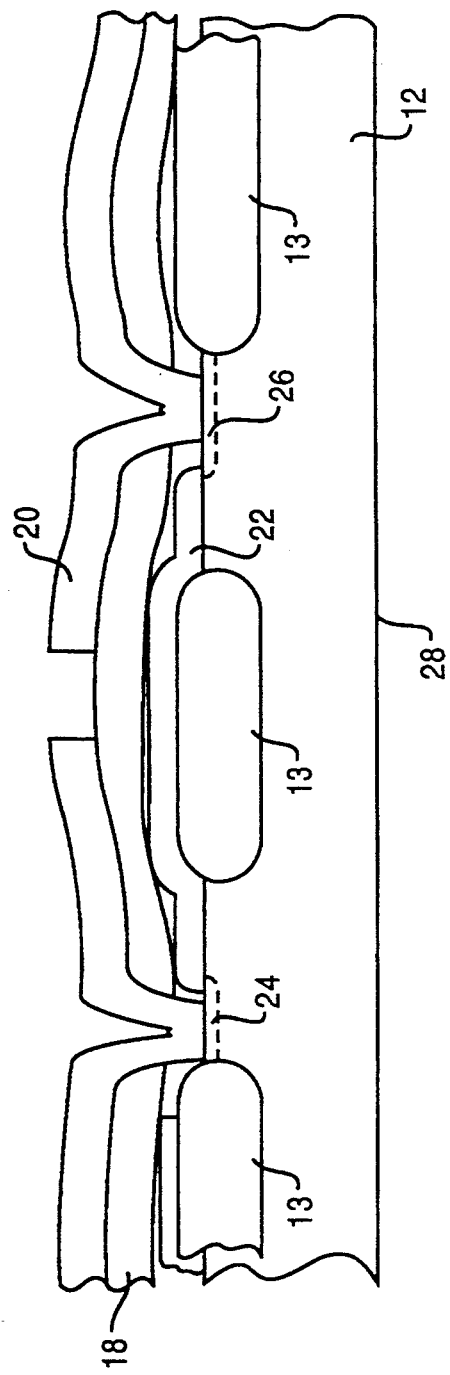
FIG. 2 is a cross-sectional view of the CMOS device of FIG. 1, but with the SOG layers removed.

Prior to the deposition of the undoped oxide in step 42, the dopants may optionally be driven out of the boron and phosphorus doped SOG layers by a thermal step and the boron and phosphorus doped SOG layers removed by a plasma or wet chemical etch (FIG. 2).

Advantageously, the RTP thermal cycle is a diffusion process which only replaces the silicon atoms in the crystal structure of silicon wafer 12 with boron or phosphorus atoms, without disturbing the crystal structure of silicon wafer 12. Thus, the crystal lattice is not disrupted and defects are not created.

Furthermore, the thickness of the junction can be more easily controlled using the RTP cycle. To achieve the shallow junctions available through diffusion, implanting machines must typically be operated at voltages below their rated operating voltages to slow the bombarding ions.

In block 46, an optional step, a backside etch may be optionally performed to clean the backside of silicon wafer 12. This step removes backside films which impose stresses upon wafer 12 causing it to bow or reduce the thermal conductivity of the wafer. Additionally, these backside films are removed because they are insulators which prevent good backside electrical contact during processing. Finally, if backside doping is required, these backside films are removed to expose the backside for doping, which coincidentally traps the metal ions within the silicon crystal lattice away from the upper surface of wafer 12, thus minimizing leakage currents.

In block 48, other known backend processing steps in a typical CMOS process are typically performed next, such as a contact photolighography process to define emulsions, and an etch process to transfer a pattern.

In block 50, metal interconnect layer 20 is deposited on top of insulating layer 18.

Figure 4:
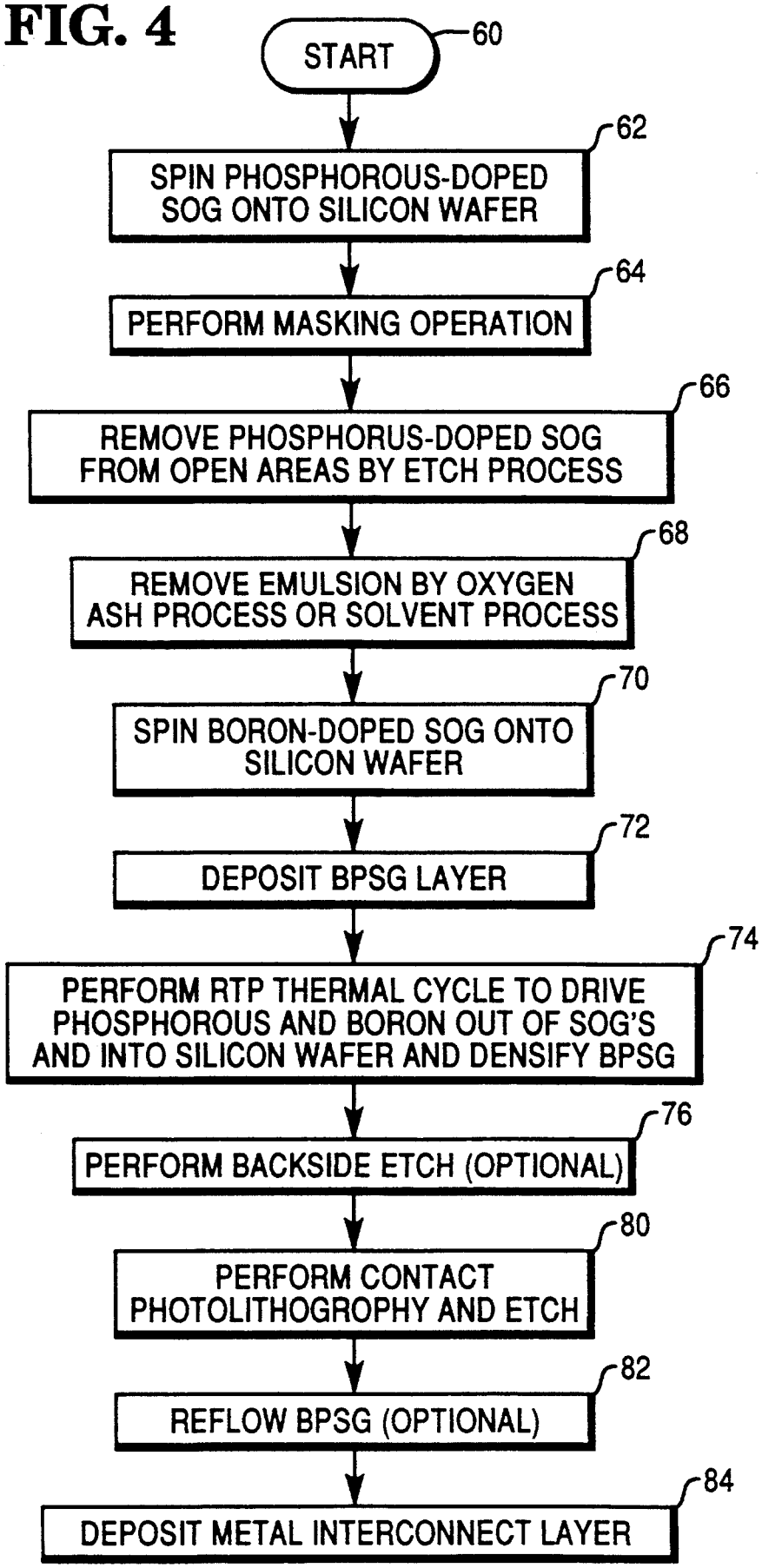
FIG. 4 is a flow diagram of a second embodiment of the present invention.

Referring now to FIG. 4, a second embodiment of the present invention is shown beginning with START 60. Under this embodiment, insulating layer 18 includes a boron-phosphorus silicon glass (BPSG) layer to improve the degree of planarization. Steps 62–70 are the same as steps 32–40 in the first embodiment of FIG. 2.

In block 72, a boron-phosphorus doped silicon glass (BPSG) is deposited as an insulating layer. During the process, the wafer is heated, which drives out the low-boiling point solvents and cures the SOG.

Prior to the deposition of the BPSG layer in step 72, the dopants may optionally be driven out of the boron and phosphorus doped SOG layers by a thermal step and the boron and phosphorus doped SOG layers removed by a plasma or wet chemical etch (FIG. 2).

In block 74, the BPSG is densified while the dopants are driven out of the SOG and into the substrate to form the shallow junctions.

In block 76, an optional backside etch is performed as in the first embodiment, block 46.

In block 80, a contact photolighography process and etch process is performed as in the first embodiment, block 48.

In block 82, an optional step is shown in which the BPSG layer is reflowed to improve planarization and to improve the step coverage of metal interconnect layer 20.

Finally, in block 84, metal interconnect layer 20 is deposited as in the first embodiment, block 50.

Although the second embodiment may provide a higher degree of planarization than the first embodiment, the first embodiment is preferred because it requires fewer process steps and has a lower thermal budget, which gives the first embodiment more control over diffusion depths.

Both embodiments employ commercially available phosphorus-doped and boron-doped SOGs which are preferably about 15% by weight of silicon.

Although the present invention has been described with particular reference to certain preferred embodiments thereof, variations and modifications of the present invention can be effected within the spirit and scope of the following claims.

What is claimed is:

1. A method for producing a shallow junction semiconductor device comprising the steps of:

spinning a layer of silicon oxide glass containing a dopant over an underlying semiconductor substrate;

removing a portion of the SOG layer including the substeps of masking the SOG layer with an emulsion while leaving the portion unmasked, removing the portion, and removing the emulsion;

spinning another layer of silicon oxide glass containing another dopant over the one layer and in place of the removed portion; and driving the one and the other dopant into the semiconductor layer to form first and second shallow junctions.

2. The method as recited in claim 1, wherein the device is a transistor.

3. The method as recited in claim 1, wherein the substrate is silicon.

4. The method as recited in claim 1, wherein the dopant is boron.

5. The method as recited in claim 1, wherein the dopant is phosphorus.

6. The method as recited in claim 1, wherein the dopant is arsenic.

7. The method as recited in claim 1, wherein the dopant is gold.

8. The method as recited in claim 1, wherein the step of removing the portion comprises the substep of:

etching away the portion.

9. The method as recited in claim 1, wherein the step of removing the emulsion comprises the substep of performing a plasma oxygen ashing process.

10. The method as recited in claim 1, wherein the step of removing the emulsion comprises the substep of performing a solvent clean process.

11. The method as recited in claim 1, wherein the step of driving comprises the substep of:

heating the device at a temperature of about 1100 degrees Celsius and for a time of about ten seconds.

12. The method as recited in claim 1 further comprising the step of:

depositing an insulating layer.

13. The method as recited in claim 12, wherein the insulating layer comprises undoped silicon oxide.

14. The method as recited in claim 12, wherein the insulating layer comprises boron-phosphorus silicon glass (BPSG).

15. The method as recited in claim 14 further comprising the step of planarizing the device including the substeps of:

densifying the insulating layer;
etching a backside of the substrate;
removing a portion of the insulating layer;
reflowing the insulating layer; and
depositing a metal interconnect layer over the insulating layer.

16. The method as recited in claim 11 further comprising the steps of:

etching a backside of the semiconductor substrate; and
depositing a metal interconnect layer over the insulating layer.

17. A method for producing a shallow junction semiconductor device comprising the steps of:

spinning a layer of silicon oxide glass containing a dopant over an underlying semiconductor substrate;
removing a portion of the SOG layer;
spinning another layer of silicon oxide glass containing another dopant over the one layer and in place of the removed portion;
driving the one and the other dopant into the semiconductor layer to form first and second shallow junctions; and
depositing an insulating layer over the one and the other SOG layers.

18. The method as recited in claim 17, wherein the insulating layer comprises undoped silicon oxide.

19. The method as recited in claim 17, wherein the insulating layer comprises boron-phosphorus silicon glass (BPSG).

20. The method as recited in claim 19 further comprising the step of planarizing the device including the substeps of:

densifying the insulating layer;
etching a backside of the substrate;
removing a portion of the insulating layer;
reflowing the insulating layer; and
depositing a metal interconnect layer over the insulating layer.

* * * * *